(12) United States Patent
Yoshida et al.

(10) Patent No.: US 7,628,616 B2
(45) Date of Patent: Dec. 8, 2009

(54) CONNECTING UNIT INCLUDING CONTACTOR HAVING SUPERIOR ELECTRICAL CONDUCTIVITY AND RESILIENCE, AND METHOD FOR PRODUCING THE SAME

(75) Inventors: Shin Yoshida, Miyagi-ken (JP); Shinichi Nagano, Miyagi-ken (JP); Koji Dono, Miyagi-ken (JP); Shuuichi Chiba, Miyagi-ken (JP)

(73) Assignee: ALPS Electric Co., Ltd., Tokyo (JP)

( * ) Notice: Subject to any disclaimer, the term of this patent is extended or adjusted under 35 U.S.C. 154(b) by 0 days.

(21) Appl. No.: 10/868,112

(22) Filed: Jun. 14, 2004

(65) Prior Publication Data

US 2004/0259406 A1    Dec. 23, 2004

(30) Foreign Application Priority Data

Jun. 20, 2003   (JP)   ............................. 2003-175650
May 20, 2004   (JP)   ............................. 2004-149846

(51) Int. Cl.
    *H01R 12/00*   (2006.01)
(52) U.S. Cl. ........................................ 439/66; 439/886
(58) Field of Classification Search ................. 439/331, 439/66, 82, 65, 71, 886
    See application file for complete search history.

(56) References Cited

U.S. PATENT DOCUMENTS 6,517,362 B2    2/2003   Hirai et al. .................... 439/82
6,613,451 B1*   9/2003   Asahara et al. ............... 439/886
6,712,625 B2*   3/2004   Saito et al. ................... 439/886
6,770,383 B2*   8/2004   Tanaka et al. ................ 439/886
2002/0115356 A1*   8/2002   Baker et al. .................. 439/886
2003/0173107 A1*   9/2003   Smith et al. .................. 439/886
2004/0185694 A1*   9/2004   Hirai ............................ 439/82

FOREIGN PATENT DOCUMENTS

JP          2002-175859        6/2002

OTHER PUBLICATIONS

Abe et al., "Hardening Behavior in Nickel Films by Ion Plating Treatment", Study on Electroless Nickel Plating (Part IV), Hokkaido Industrial Research Institute, Report No. 294, pp. 59-67, 1995. (English translation enclosed).
Morikawa et al., "Amorphous plating and the applications of this", Technology Research Institute of Osaka Prefecture, Surface Chemistry Group, May 6, 1998, 22 pages. (English translation enclosed).

* cited by examiner

*Primary Examiner*—Felix O Figueroa
(74) *Attorney, Agent, or Firm*—Bayer Law Group LLP (57) ABSTRACT

A connecting unit for establishing a connection with external connecting portions of an electronic device includes a base and a plurality of spiral contactors having a conductive layer and an auxiliary resilient layer. The top face, the bottom face, and both side faces of the conductive layer are completely surrounded by the auxiliary resilient layer. The conductive layer is composed of a material having a specific resistance lower than the specific resistance of the auxiliary resilient layer. The auxiliary resilient layer is composed of a material having a yield point and an elastic modulus higher than the yield point and the elastic modulus of the conductive layer.

10 Claims, 10 Drawing Sheets

CONNECTING UNIT INCLUDING CONTACTOR HAVING SUPERIOR ELECTRICAL CONDUCTIVITY AND RESILIENCE, AND METHOD FOR PRODUCING THE SAME

BACKGROUND OF THE INVENTION

1. Field of the Invention

The present invention relates to a connecting unit in the form of an integrated circuit (IC) socket for loading, for example, an IC, and in particular, to a connecting unit including contactors to be put in contact with external connecting portions of, for example, an IC, the contactors having superior electrical conductivity and resilience, and to a method for producing the same.

2. Description of the Related Art

A semiconductor inspecting unit disclosed in Japanese Unexamined Patent Application Publication No. 2002-175859 is used for electrically connecting a semiconductor device to, for example, an external circuit board temporarily. A large number of spherical contactors disposed in a grid or a matrix shape are provided on the back surface of the semiconductor device. An insulating substrate having a large number of holes is disposed facing the semiconductor device. Spiral contactors are disposed in the holes.

When the semiconductor device is pressed toward the insulating substrate, spiral contactors make contact with the external surfaces of the spherical contactors disposed on the back surface of the semiconductor device such that the spiral contactors wind around the spherical contactors. Thus, the spherical contactors and the spiral contactors are reliably connected to each other electrically.

In a known method, the spiral contactors are formed by, for example, pressing. As products become reduced in size, the semiconductor inspecting unit must be electrically connected with a semiconductor device reliably in a fine area. Therefore, the possibility of forming the spiral contactors by pressing is limited. In order to further reduce the size, the spiral contactors must be formed by a new alternative method instead of by pressing.

In addition to further reducing the size, the spiral contactors require superior electrical conductivity and resilience.

With regard to this, Japanese Unexamined Patent Application Publication No. 2002-175859 discloses various methods for forming the spiral contactors in FIGS. 37 to 39.

For example, according to the method disclosed in FIG. 37, spiral contractors are mainly composed of nickel formed by plating. In a fine contact point using such a spiral contactor, however, excessively high conductor resistance leads to failure or impossibility of inspection.

According to the method disclosed in FIG. 38, the spiral contactors include a substrate 63 in addition to a copper foil 4' and other members. Since this structure decreases the resilience of the spiral contactors, the spiral contactors cannot sufficiently perform elastic deformation depending on the shape of the spherical contactors disposed on the semiconductor device, thereby causing contact failure.

Furthermore, no appropriate improvement in either the electrical conductivity or the resilience of the spiral contactors is mentioned in the above patent document.

SUMMARY OF THE INVENTION

In order to solve the above problems, it is an object of the present invention to provide a connecting unit including contactors to be put in contact with external connecting portion of, for example, an IC, the contactors having superior electrical conductivity and resilience, and to a method for producing the same.

According to the present invention, a connecting unit for establishing a connection with a plurality of external connecting portions of an electronic device, the connecting unit includes a base; and a plurality of spiral contactors formed on the base and having a spiral shape, the spiral contactors being put in contact with the external connecting portions of the electronic device, wherein each of the spiral contactors includes a conductive layer and an auxiliary resilient layer laminated to each other, the conductive layer is composed of a material having a specific resistance lower than the specific resistance of the auxiliary resilient layer, and the auxiliary resilient layer is composed of a material having a yield point and an elastic modulus higher than the yield point and the elastic modulus of the conductive layer.

According to the present invention, a contactor segment that forms each turn of the spiral contactors is formed by laminating the conductive layer and the auxiliary resilient layer. Accordingly, both electrical conductivity and resilience of the spiral contactors are appropriately improved. The spiral contactors are appropriately deformed depending on the shape of the connecting terminals of the electronic device, thus allowing a reliable connection. In addition, testing of the electrical properties of the electronic device can be appropriately performed.

The conductive layer is preferably surrounded by the auxiliary resilient layer completely.

Alternatively, the auxiliary resilient layer is preferably surrounded by the conductive layer completely.

The auxiliary resilient layer is preferably composed of Ni or Ni—X wherein X is at least one element selected from the group consisting of P, W, Mn, Ti, and Be.

The conductive layer is preferably composed of Cu, Au, Ag, Pd, or a copper alloy.

The copper alloy forming the conductive layer is preferably a Corson alloy containing Cu, Si, and Ni.

The Corson alloy containing Cu, Si, and Ni has both high electrical conductivity and high strength, and therefore, is suitable for the material of the spiral contactors.

In particular, when the auxiliary resilient layer is composed of Ni or Ni—X wherein X is at least one element selected from the group consisting of P, W, Mn, Ti, and Be, and the conductive layer is composed of a copper alloy, an adherent layer is preferably disposed between the conductive layer and the auxiliary resilient layer, the adherent layer being composed of a metal selected from the group consisting of Cu, Ag, Au, Ru, Rh, Pd, Os, Ir, and Pt.

When Ni or Ni—X wherein X is at least one element selected from the group consisting of P, W, Mn, Ti, and Be is directly formed by plating, in particular, by electroless plating on the surface of a conductive material composed of a copper alloy containing a plurality of elements, forming the auxiliary resilient layer uniformly is difficult to achieve.

According to the present invention, the adherent layer composed of a metal selected from the group consisting of Cu, Ag, Au, Ru, Rh, Pd, Os, Ir, and Pt is disposed between the conductive layer and the auxiliary resilient layer. Therefore, the auxiliary resilient layer composed of Ni or Ni—X wherein X is at least one element selected from the group consisting of P, W, Mn, Ti, and Be is uniformly formed.

The adherent layer preferably has a thickness of 0.01 to 0.1 µm.

According to the present invention, a method for producing a connecting unit for establishing a connection with a plurality of external connecting portions of an electronic device, the connecting unit including a base and a plurality of spiral contactors formed on the base and having a spiral shape, the spiral contactors being put in contact with the external connecting portions of the electronic device, the method includes forming the plurality of spiral contactors by laminating a conductive layer and an auxiliary resilient layer by plating, wherein the conductive layer is composed of a material having a specific resistance lower than the specific resistance of the auxiliary resilient layer, and the auxiliary resilient layer is composed of a material having a yield point and an elastic modulus higher than the yield point and the elastic modulus of the conductive layer.

According to the present invention, both the conductive layer and the auxiliary resilient layer are formed by plating. Accordingly, the size of the spiral contactors is reduced. In addition, both electrical conductivity and resilience of the spiral contactors are appropriately improved.

According to the present invention, either the conductive layer or the auxiliary resilient layer may be formed with a metal foil so as to have a spiral shape, and then the auxiliary resilient layer or the conductive layer may be laminated by plating.

According to the present invention, a plurality of spiral contactors composed of either the conductive layer or the auxiliary resilient layer are preferably formed, and then the periphery of the spiral contactors is preferably surrounded by the auxiliary resilient layer or the conductive layer by electroless plating.

According to the present invention, the conductive layer composed of a copper alloy is preferably formed; an adherent layer composed of a metal selected from the group consisting of Cu, Ag, Au, Ru, Rh, Pd, Os, Ir, and Pt is preferably formed on the conductive layer; and the auxiliary resilient layer composed of Ni or Ni—X wherein X is at least one element selected from the group consisting of P, W, Mn, Ti, and Be is preferably formed on the adherent layer.

When Ni or Ni—X wherein X is at least one element selected from the group consisting of P, W, Mn, Ti, and Be is directly formed by plating, in particular, by electroless plating on the surface of a conductive material composed of a copper alloy containing a plurality of elements, forming the auxiliary resilient layer having a uniform thickness is difficult to achieve.

According to the present invention, the adherent layer composed of a metal selected from the group consisting of Cu, Ag, Au, Ru, Rh, Pd, Os, Ir, and Pt is formed on the conductive layer. Therefore, the auxiliary resilient layer composed of Ni or Ni—X wherein X is at least one element selected from the group consisting of P, W, Mn, Ti, and Be is uniformly formed.

Alternatively, the auxiliary resilient layer composed of Ni or Ni—X wherein X is at least one element selected from the group consisting of P, W, Mn, Ti, and Be may be formed; an adherent layer composed of a metal selected from the group consisting of Cu, Ag, Au, Ru, Rh, Pd, Os, Ir, and Pt may be formed on the auxiliary resilient layer; and the conductive layer composed of a copper alloy may be formed on the adherent layer.

When the auxiliary resilient layer is composed of NiP (nickel-phosphorus), the NiP preferably has a composition $Ni_{100-X}P_X$ wherein X satisfies $30 \geq x \geq 10$ by atomic percent.

When the phosphorus concentration in the NiP (nickel-phosphorus) alloy used as the auxiliary resilient layer is 10 atomic percent or more, the precipitation of nickel crystal is suppressed, and therefore, resilient properties such as mechanical strength are improved. In addition, stress (in particular, compressive stress) by plating is suppressed, and therefore, generation of defects by plating can be suppressed.

When the phosphorus concentration in the NiP alloy exceeds 30 atomic percent, various intermetallic compounds containing Ni and P are precipitated. The resilient properties of the NiP alloy are deteriorated because of the very high hardness and brittleness due to the intermetallic compounds.

When the phosphorus concentration in the NiP alloy is 10 to 30 atomic percent, the NiP alloy has not only ductility but also desired resilient properties due to the presence of an amorphous phase. An example of the desired resilient properties includes a standard in which the tensile strength is at least 1,000 MPa.

The thickness of the adherent layer is preferably controlled to be 0.01 to 0.1 μm.

The auxiliary resilient layer is preferably formed with Ni or Ni—X wherein X is at least one element selected from the group consisting of P, W, Mn, Ti, and Be.

The conductive layer is preferably formed with Cu, Au, Ag, Pd, or a copper alloy.

The copper alloy used for forming the conductive layer is preferably a Corson alloy containing Cu, Si, and Ni.

According to the method for producing the spiral contactors of the present invention, the connecting unit is reduced in size. In addition, spiral contactors being reduced in size and having superior electrical conductivity and resilience are produced by a very simple method.

DESCRIPTION OF THE PREFERRED EMBODIMENTS

Figure 1:
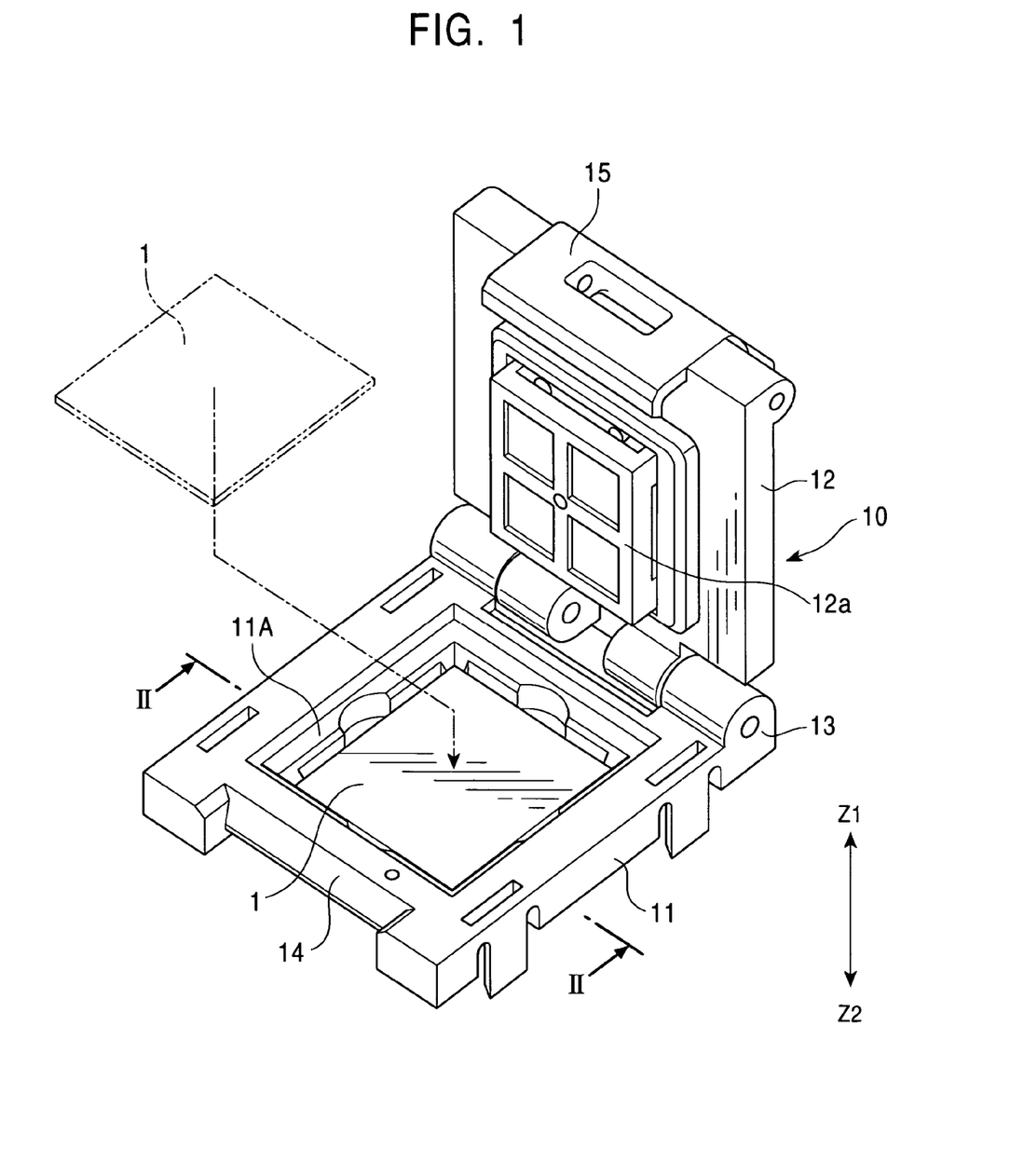
FIG. 1 is a perspective view of an inspecting unit used in a test to check the operation of an electronic device.
Figure 2:
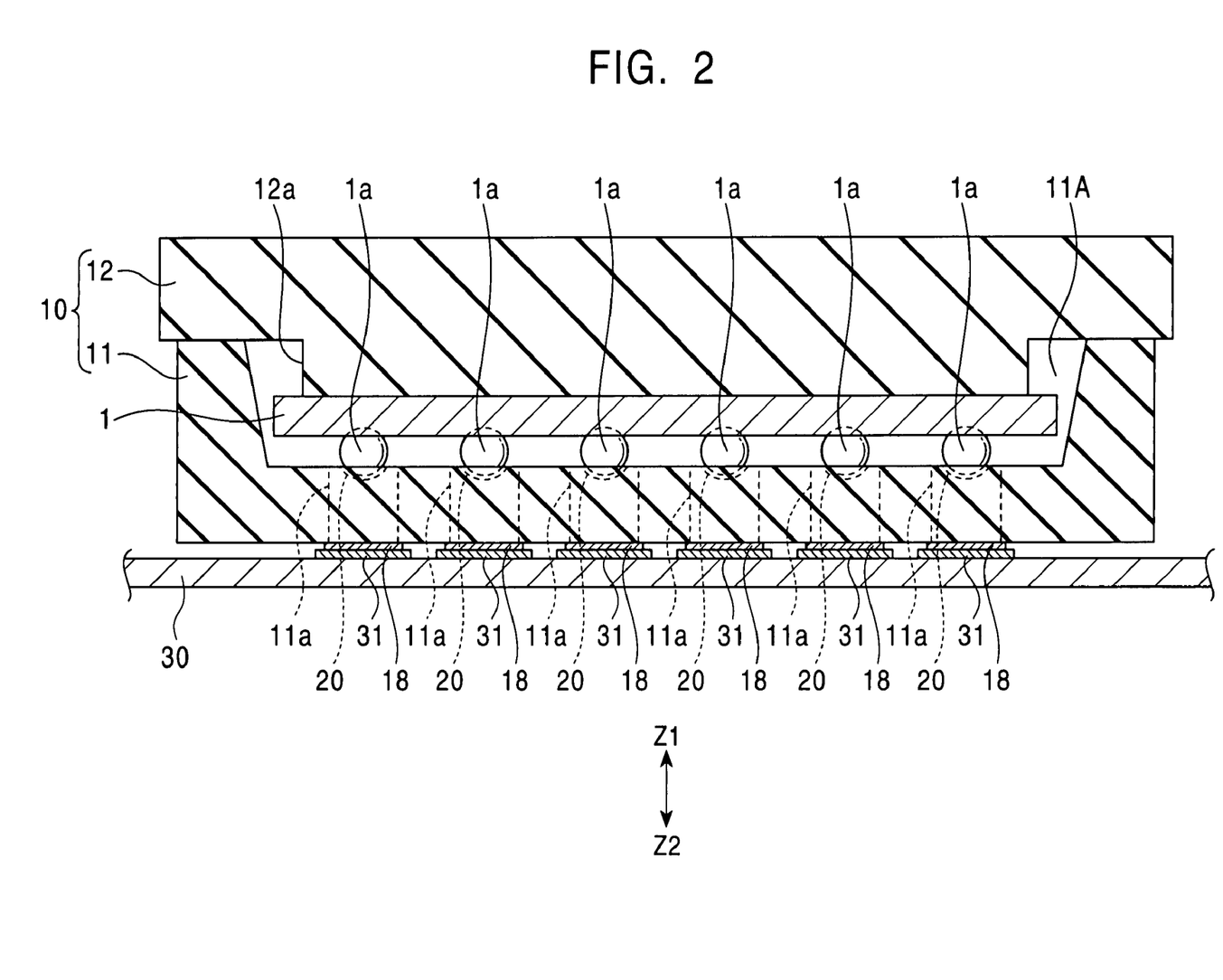
FIG. 2 is a cross-sectional view taken along line II-II in FIG. 1, wherein the electronic device is loaded.

FIG. 1 is a perspective view of an inspecting unit used in a test to check the operation of an electronic device. FIG. 2 is a cross-sectional view taken along line II-II in FIG. 1, wherein the electronic device is loaded.

Referring to FIG. 1, an inspecting unit 10 includes a base 11 and a cover 12 that can be opened and closed by means of a hinge 13 disposed at an edge of the base 11. The base 11 and the cover 12 are composed of an insulating material such as a resin. A loading area (base) 11A that forms a recess in the Z2 direction in FIG. 1 is disposed at the center of the base 11. An electronic device 1 such as a semiconductor device is loaded in the loading area 11A. A lock-engaging member 14 is disposed at the edge adjacent to the base 11.

As shown in FIG. 2, this inspecting unit 10 inspects the electronic device 1 having a large number of spherical contactors (i.e., external connecting portions) 1a arranged in a matrix shape (a grid shape) on the bottom surface thereof.

Referring to FIG. 2, a plurality of through holes 11a are disposed in the loading area (base) 11A corresponding to the spherical contactors 1a of the electronic device 1. The holes 11a have a predetermined diameter and pass from the surface of the loading area 11A through to the back surface of the base 11.

A plurality of spiral contactors 20, that is, contactors having a spiral shape are disposed on the top surface of the holes 11a (i.e., the surface of the loading area 11A).

Figure 3:
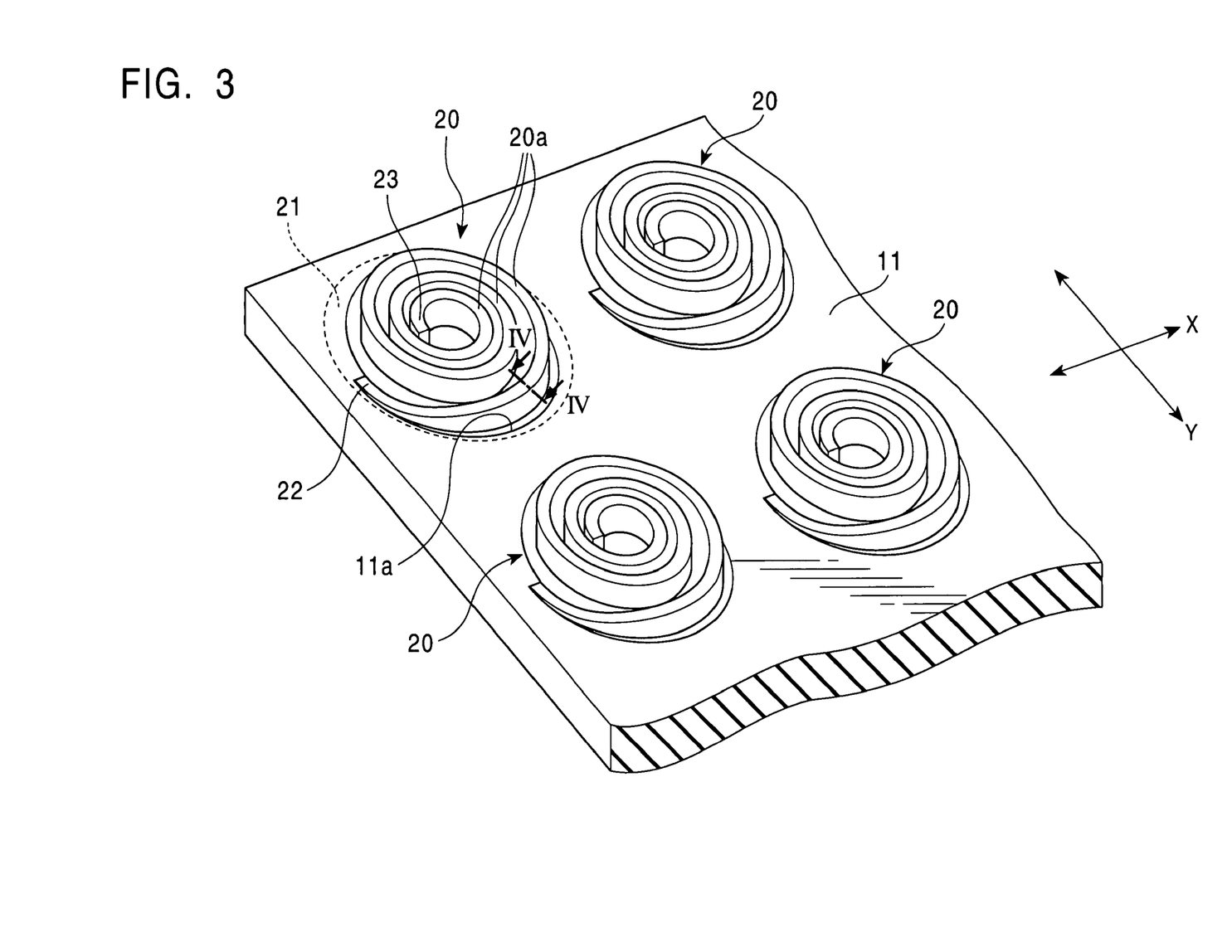
FIG. 3 is an enlarged perspective view showing the shape of the spiral contactors of the present invention.

FIG. 3 is a perspective view of the spiral contactors 20. Referring to FIG. 3, the plurality of spiral contactors 20 are disposed on the base 11 at predetermined intervals in the X direction and in the Y direction in the figure.

Each of the spiral contactors 20, for example the spiral contactor 20 shown at the upper left in FIG. 3, includes a base portion 21 fixed at the edge of an upper open end of a hole 11a. A winding starting end 22 of the spiral contactor 20 is disposed adjacent to the base portion 21. A winding terminal 23 extending spirally from the winding starting end 22 is disposed at the center of the hole 11a.

A conductive portion (not shown in the figure) is disposed at the inner wall of the hole 11a. The upper end of the conductive portion is connected to the base portion 21 of the spiral contactor 20 with, for example, an electroconductive adhesive. A connecting terminal 18 connected to the conductive portion is disposed at a lower open end of the hole 11a.

Referring to FIG. 2, a printed circuit board 30 having a plurality of wiring patterns and other circuit elements is disposed under the base 11. The base 11 is fixed on the printed circuit board 30. Counter electrodes 31 facing the connecting terminals 18 disposed at the bottom surface of the base 11 are disposed on the surface of the printed circuit board 30. Each connecting terminal 18 is in contact with the corresponding counter electrode 31. Thus, the electronic device 1 is electrically connected to the printed circuit board 30 through the inspecting unit 10.

Referring to FIG. 1, a protruded pressing portion 12a for pressing the electronic device 1 downward in the figure is disposed at the center of the inner face of the cover 12 in the inspecting unit 10. The protruded pressing portion 12a is disposed facing the loading area 11A. A lock member 15 is disposed on the cover 12 on the edge opposite the hinge 13.

An urging member such as a coil spring (not shown in the figure) is disposed between the inner face of the cover 12 and the pressing portion 12a. The urging member urges the pressing portion 12a such that the pressing portion 12a is pushed away from the inner face of the cover 12. Accordingly, when the electronic device 1 is loaded in the holes 11a and the cover 12 is closed to lock, the electronic device 1 can be resiliently pressed such that the electronic device 1 is pushed into contact with the surface of the loading area 11A (i.e., in the Z2 direction in FIG. 1).

The dimensions of the loading area 11A of the base 11 are about the same as the outline dimension of the electronic device 1. When the electronic device 1 is loaded on the loading area 11A and the cover 12 is closed to lock, the spherical contactors 1a disposed on the electronic device 1 precisely align with the spiral contactors 20 disposed on the inspecting unit 10.

When the lock member 15 of the cover 12 is locked with the lock-engaging member 14 of the base 11, the electronic device 1 is pressed by the pressing portion 12a downward in the figure. The spherical contactors 1a press the spiral contactors 20 in the direction of the inner part of the holes 11a (i.e., downward in the figure). At the same time, the outline of each spiral contactor 20 deforms such that the spiral contactor 20 is extended by pressing in the direction from the winding terminal 23 to the winding starting end 22 (i.e., from the center of the spiral to the outside). Each spiral contactor 20 winds around the external surface of the corresponding spherical contactor 1a. Thus, the spherical contactors 1a are connected to the spiral contactors 20.

FIGS. 4A to 4F are cross-sectional views wherein a contactor segment 20a that forms each turn of a spiral contactor 20 is cut in the direction shown by a line IV and is viewed from the direction shown by arrows in FIG. 3.

Figure 4A:
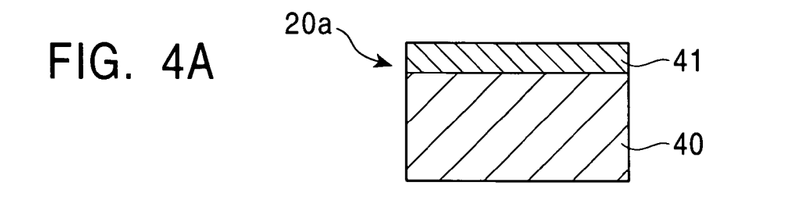
FIGS. 4A to 4F are cross-sectional views wherein a contactor segment that forms each turn of a spiral contactor of the present invention is cut in the direction of the thickness from a direction parallel to the width.

Referring to FIG. 4A, an auxiliary resilient layer 41 is laminated on a conductive layer 40. The conductive layer 40 is composed of a material having a specific resistance lower than the specific resistance of the auxiliary resilient layer 41. The auxiliary resilient layer 41 is composed of a material having a yield point and an elastic modulus higher than the yield point and the elastic modulus of the conductive layer 40.

As shown in FIG. 4A, the conductive layer 40 and the auxiliary resilient layer 41 are laminated. In this case, the conductive layer 40 provides superior electrical conductivity of the spiral contactors 20 and the auxiliary resilient layer 41 provides superior resilience of the spiral contactors 20.

In FIG. 4A, the conductive layer 40 may be laminated on the auxiliary resilient layer 41.

In FIG. 4A, both the conductive layer 40 and the auxiliary resilient layer 41 may be formed by plating. Alternatively, the conductive layer 40, i.e., the lower layer, may be composed of a metal foil and the auxiliary resilient layer 41, i.e., the upper layer, may be formed by plating. When the auxiliary resilient layer 41 is formed as the lower layer, the auxiliary resilient layer 41 may be composed of a metal foil and the conductive layer 40, i.e., the upper layer, may be formed by plating.

Figure 4B:
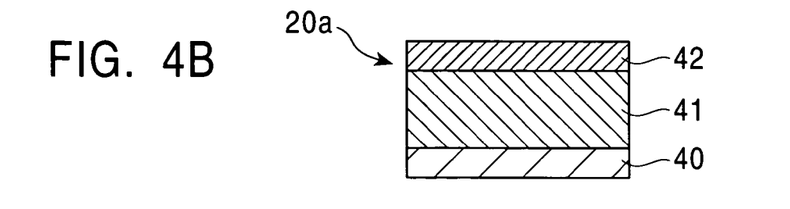

Referring to FIG. 4B, the conductive layer 40, the auxiliary resilient layer 41, and a coating layer 42 are laminated in this order. The coating layer 42 is formed in order to improve the hardness and the wear resistance. The coating layer 42 is preferably composed of a material having a specific resistance lower than that of the auxiliary resilient layer 41 in order to decrease the contact resistance between the contactors of the electronic device and spiral contactors 20.

Figure 4C:
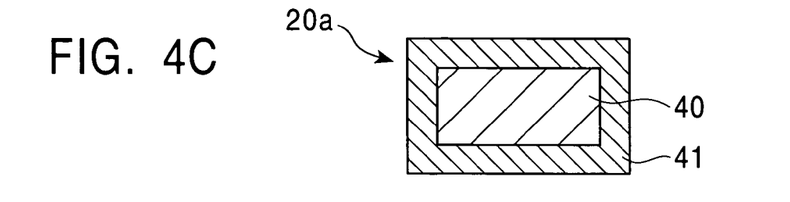

Referring to FIG. 4C, the top face, the bottom face, and both side faces of the conductive layer 40 are completely surrounded by the auxiliary resilient layer 41. The conductive layer 40 is preferably surrounded by the auxiliary resilient layer 41 as shown in FIG. 4C because this structure appropriately improves the resilience of the spiral contactor 20.

Alternatively, the top face, the bottom face, and both side faces of the auxiliary resilient layer 41 may be completely surrounded by the conductive layer 40. This structure effectively decreases eddy current loss, in particular, when used in a high frequency band. The conductive layer 40 or the auxiliary resilient layer 41 is formed by, for example, electroless plating in order to completely surround the periphery of the base metal layer.

Figure 4D:
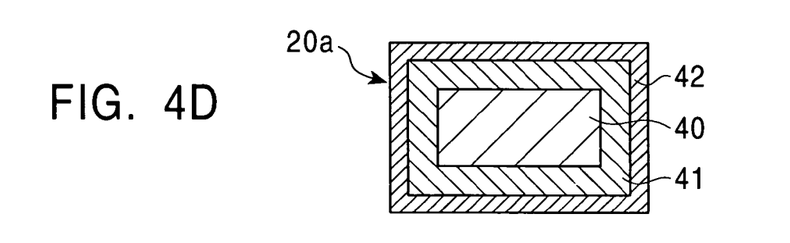

FIG. 4D shows an application of FIG. 4C. For example, the top face, the bottom face, and both side faces of the conductive layer 40 are completely surrounded by the auxiliary resilient layer 41. Furthermore, the surface of the auxiliary resilient layer 41 is covered with the coating layer 42.

Figure 4E:
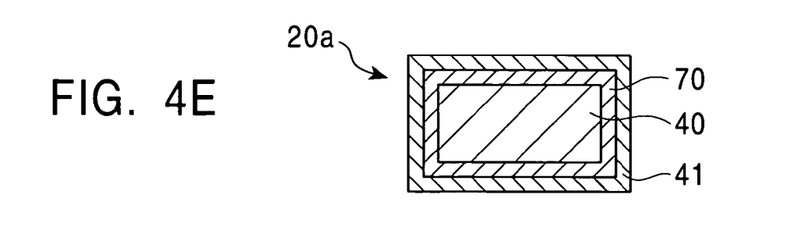

Referring to FIG. 4E, an adherent layer 70 is disposed between the auxiliary resilient layer 41 and the conductive layer 40.

In the contactor segment shown in FIG. 4E, the conductive layer 40 is composed of a copper alloy; the auxiliary resilient layer 41 is composed of Ni or Ni—X wherein X is at least one element selected from the group consisting of P, W, Mn, Ti, and Be; and the adherent layer 70 is composed of a metal selected from the group consisting of Cu, Ag, Au, Ru, Rh, Pd, Os, Ir, and Pt.

When Ni or Ni—X wherein X is at least one element selected from the group consisting of P, W, Mn, Ti, and Be is directly formed by plating, in particular, by electroless plating on the surface of a conductive material composed of a copper alloy containing a plurality of elements, forming the auxiliary resilient layer 41 having a uniform thickness is difficult to achieve.

As shown in FIG. 4E, the adherent layer 70 disposed between the conductive layer 40 and the auxiliary resilient layer 41 readily allows the auxiliary resilient layer 41 composed of Ni or Ni—X wherein X is at least one element selected from the group consisting of P, W, Mn, Ti, and Be and having a uniform thickness to be formed. Consequently, this structure stabilizes the resilient properties of the spiral contactors. Furthermore, the adherent layer 70 increases the adhesiveness of the plated auxiliary resilient layer 41. The auxiliary resilient layer 41 has a thickness of 0.5 to 10 μm.

The adherent layer 70 preferably has a thickness of 0.01 to 0.1 μm.

The copper alloy that forms the conductive layer 40 is preferably a Corson alloy containing Cu, Si, and Ni.

The Corson alloy containing Cu, Si, and Ni has both high electrical conductivity and high strength, and therefore, is suitable for the material of the spiral contactors 20.

According to the present embodiment, a Corson alloy having a composition of Cu—Ni—Si—Mg is used. The Corson alloy contains 96.2 mass percent of Cu, 3.0 mass percent of Ni, 0.65 mass percent of Si, and 0.15 mass percent of Mg.

According to the Corson alloy having this composition ratio, the electrical conductivity at 20° C. is 42 to 53% IACS (International Annealed Copper Standard), the tensile strength is 607 to 840 N/mm$^2$, the specific resistance at 20° C. is 38.3 nΩ·m, the thermal conductivity is 180 W/mK, the coefficient of thermal expansion is $17.6 \times 10^{-6}$/K (20° C. to 300° C.), the elastic modulus is 131 kN/mm$^2$, and the density is 8.82 g/cm$^3$.

Alternatively, the top face, the bottom face, and both side faces of the auxiliary resilient layer 41 may be completely surrounded by the conductive layer 40 through the adherent layer 70 disposed therebetween.

Figure 4F:
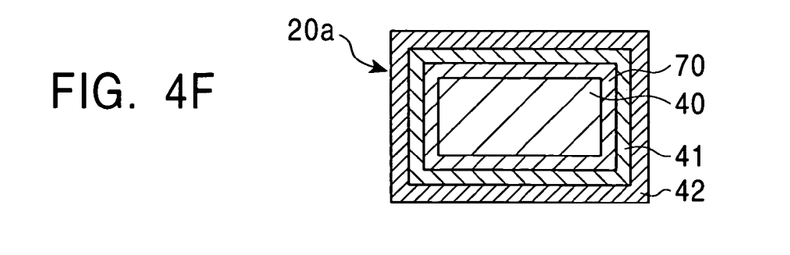

FIG. 4F shows an application of FIG. 4E. For example, the top face, the bottom face, and both side faces of the conductive layer 40 are completely surrounded by the auxiliary resilient layer 41 through the adherent layer 70 disposed therebetween. Furthermore, the surface of the auxiliary resilient layer 41 is covered with the coating layer 42. The coating layer 42 has a thickness of 0.1 to 3 μm.

According to the present invention, the conductive layer 40 is preferably composed of Cu, Au, Ag, Pd, or a copper alloy.

The auxiliary resilient layer 41 is preferably composed of Ni or Ni—X wherein X is at least one element selected from the group consisting of P, W, Mn, Ti, and Be.

The coating layer 42 is preferably composed of Au, Ag, Pd, or Sn.

In particular, when the auxiliary resilient layer 41 is composed of NiP, the NiP preferably has a composition $Ni_{100-x}P_x$ wherein X satisfies $30 \geq x \geq 10$ by atomic percent.

When the phosphorus concentration in the NiP (nickel-phosphorus) alloy used as the auxiliary resilient layer 41 is 10 atomic percent or more, the precipitation of nickel crystal is suppressed, and therefore, resilient properties such as mechanical strength are improved. In addition, stress (in particular, compressive stress) by plating is suppressed, and therefore, generation of defects by plating can be suppressed.

When the phosphorus concentration in the NiP alloy exceeds 30 atomic percent, various intermetallic compounds containing Ni and P are precipitated. The resilient properties of the NiP alloy are deteriorated because of the very high hardness and brittleness due to the intermetallic compounds.

When the phosphorus concentration in the NiP alloy is 10 to 30 atomic percent, the NiP alloy has not only ductility but also desired resilient properties due to the presence of an amorphous phase. An example of the desired resilient properties includes a standard in which the tensile strength is at least 1,000 MPa.

Figure 5:
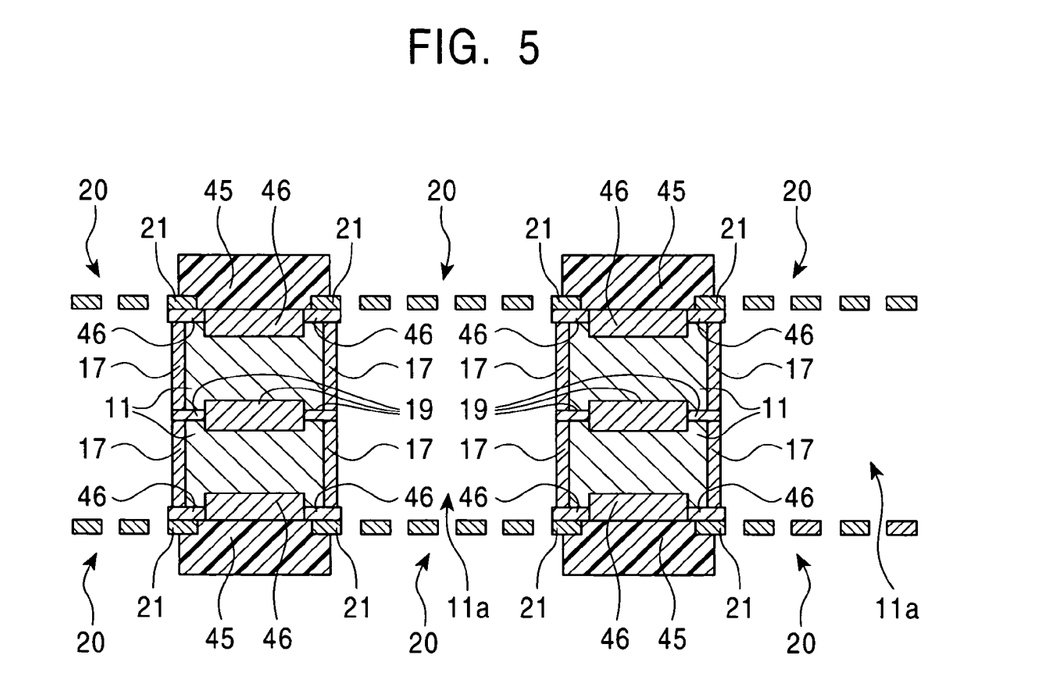
FIG. 5 is a partial cross-sectional view showing a base having spiral contactors in both sides thereof.

FIG. 5 shows a modification of the inspecting unit 10 shown in FIG. 2. FIG. 5 is an enlarged partial cross-sectional view showing a part of a base 11 of the inspecting unit 10. In FIG. 5, members having the same reference numeral as in FIGS. 1 to 3 indicate the same members shown in FIGS. 1 to 3.

In FIG. 5, a plurality of spiral contactors 20 are disposed on both the upper part and lower part of the base 11. Referring to FIG. 5, holes 11a are formed in the base 11. The holes 11a are disposed at positions facing the spiral contactors 20. Conductive portions 17 are disposed at the inner walls of the holes 11a. The conductive portions 17 are formed by, for example, copper plating.

As shown in FIG. 5, the base 11 is separately formed at the upper part and the lower part. The upper part and the lower part are fixed by an anisotropic conductive adhesive 19 applied on the opposing face.

Referring to FIG. 5, base portions 21 of spiral contactors 20 disposed at a predetermined interval in the plane direction are connected with a guide frame 45. The base portions 21 and the guide frame 45 are fixed to the base 11 with an anisotropic conductive adhesive 46 applied on the surface of the base 11.

Methods for producing a spiral contactor 20 according to the present invention will now be described with reference to FIGS. 6A to 6F and FIGS. 7A to 7E.

Figure 6A:
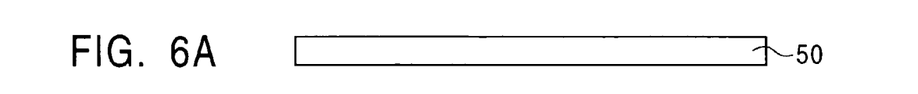
FIGS. 6A to 6F are process drawings showing a first method of the present invention.

Referring to FIG. 6A, a substrate 50 is preferably composed of a conductive material because an underlayer is not required in the following plating process. For example, the substrate 50 is composed of copper and has a thickness of 70 μm. The substrate 50 may be composed of an insulating material.

Figure 6B:
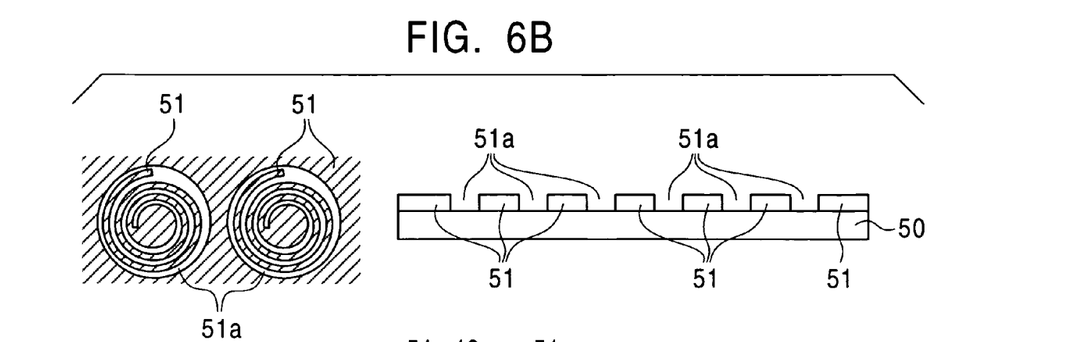

In the step shown in FIG. 6B, a resist 51 is applied on the substrate 50. The resist 51 is exposed and developed according to the shape of the spiral contactor 20. A pattern 51a of the spiral contactor 20 is formed on the resist 51. The left figure in FIG. 6B is a plan view of the pattern 51a of the spiral contactor 20 formed on the resist 51. In the figure, the shaded area shows the area where the resist 51 remains after the exposure and the development. The white area shows the pattern 51a formed by removing the resist 51 in the exposure and the development. After the pattern 51a is formed on the resist 51 by exposing and developing, the substrate 50 is subjected to heat treatment in order to cure the resist 51.

Figure 6C:
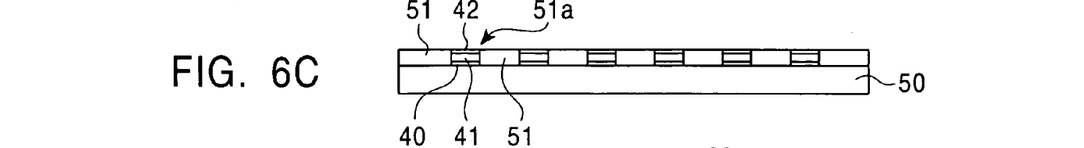

Referring to FIG. 6C, a conductive layer 40, an auxiliary resilient layer 41, and a coating layer 42 are formed by plating in this order on the surface of the substrate 50 exposed in the pattern 51a. These layers are formed by general electrolytic plating. Thus, the spiral contactor 20 having the shape in cross-section shown in FIG. 4B is formed. Each time a layer is formed by plating, the substrate is washed to remove contamination of the plated surface. Then, the subsequent plating step is performed.

In the step shown in FIG. 6C, for example, two layers composed of the conductive layer 40 and the auxiliary resilient layer 41 may be formed by plating on the substrate 50. In this case, the spiral contactor 20 having the shape in cross-section shown in FIG. 4A is formed.

Figure 6D:
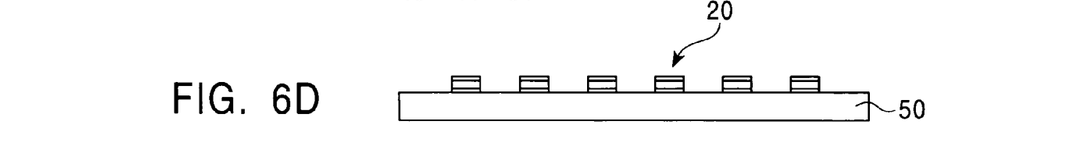

In the step shown in FIG. 6D, the remaining resist 51 is removed. Subsequently, the substrate 50 is washed and then dried.

Figure 6E:
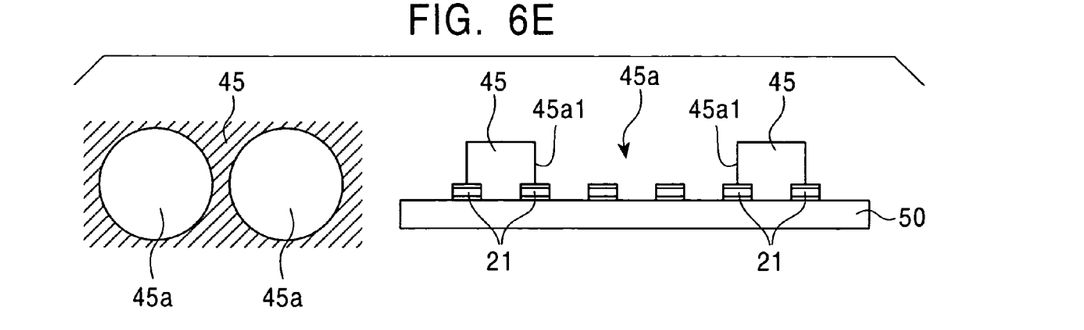

In the step shown in FIG. 6E, a guide frame 45 composed of an insulating material such as polyimide is fixed in position such that a hole 45a of the guide frame 45 faces to the corresponding spiral contactors 20. In addition, the guide frame 45 is fixed in position such that the periphery 45a1 of the hole 45a is overlapped with the base portion 21 of the spiral contactor 20. Subsequently, the guide frame 45, is applied on the base portions 21 and on a part of the substrate 50 disposed between the base portions 21. The left figure in FIG. 6E is a plan view of the guide frame 45.

As shown in the left figure in FIG. 6E, the shaded area shows the guide frame 45. In the guide frame 45, holes 45a are formed at positions facing the corresponding spiral contactors 20.

For example, a thermosetting resin composed of epoxy resin is applied on the bottom surface of the guide frame 45. As described above, the guide frame 45 is fixed in position and applied. Subsequently, heat treatment is performed in order to cure the thermosetting resin. Thus, the guide frame 45 is fixed on the base portions 21 and on the part of the substrate 50 disposed between the base portions 21.

Figure 6F:
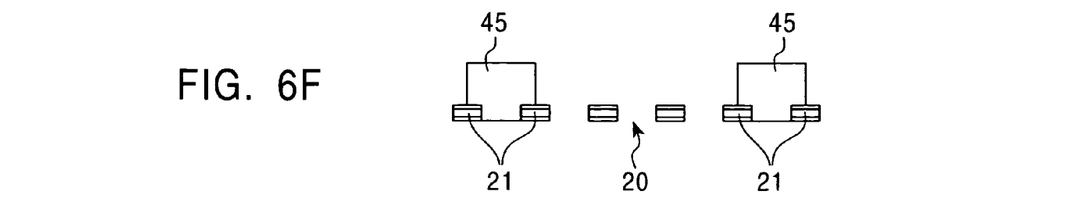

In the step shown in FIG. 6F, the substrate 50 is removed by, for example, etching. Subsequently, the resultant spiral contactors 20 including the guide frame 45 are washed and then dried.

As shown in the step in FIG. 6E, adjacent base portions 21 of the spiral contactors 20 are connected by the guide frame 45. Therefore, the spiral contactors 20 are not separated even after removing the substrate 50 in the step shown in FIG. 6F.

The method shown in FIGS. 7A to 7E will now be described.

Figure 7A:
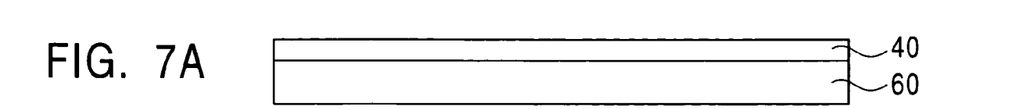
FIGS. 7A to 7E are process drawings showing a second method of the present invention.

Referring to FIG. 7A, a conductive layer 40 of the present invention composed of a metal foil is applied on a substrate 60 composed of an insulating resin such as polyimide. Alternatively, the metal foil may be an auxiliary resilient layer 41 of the present invention. The substrate 60 need not be an insulating member. The use of the substrate 60 composed of an insulating material such as a resin is preferable because the substrate 60 can be used as the guide frame 45 in the following step as described in the step shown in FIG. 6E.

Figure 7B:
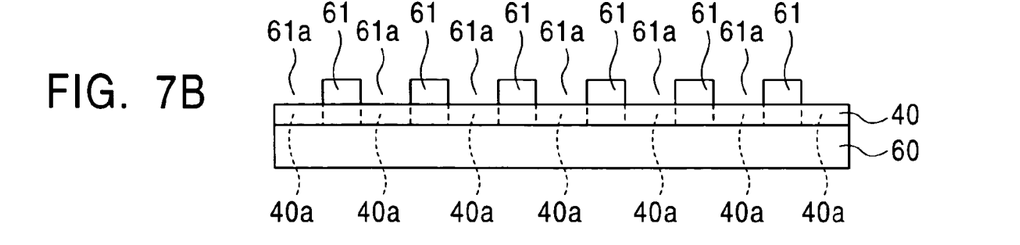

In the step shown in FIG. 7B, a resist 61 is applied on the conductive layer 40. The resist 61 is exposed and developed such that a part of the resist 61 having the shape of the spiral contactors 20 remains and the other part of the resist 61 is removed. In other words, a pattern 61a formed in the resist 61 has the opposite pattern of the resist 51 described in FIG. 6B. In this case, referring to the left figure in FIG. 6B, the shaded area shows the pattern 61a formed in the resist 61 and the white area shows the area where the resist 61 remains.

Subsequently, a conductive layer 40a exposed in the pattern 61a is removed by, for example, etching. The conductive layer 40 having the shape of the spiral contactor 20 remains on the substrate 60.

Figure 7C:
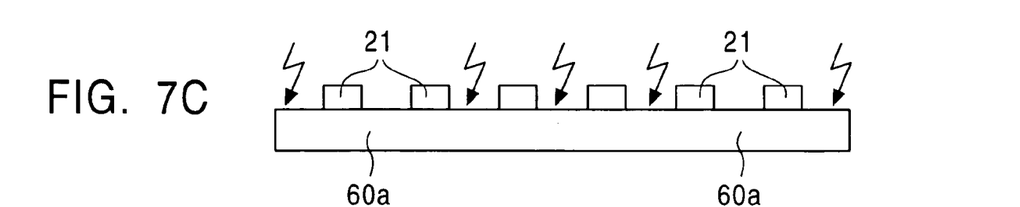

In the step shown in FIG. 7C, the remaining resist 61 is removed. Subsequently, a part of the substrate 60 is removed using, for example, a laser (shown by zigzagged arrows in the figure) such that the other part of the substrate 60, i.e., a substrate 60a, disposed just between the base portions 21 of the spiral contactor 20 remains.

Figure 7D:
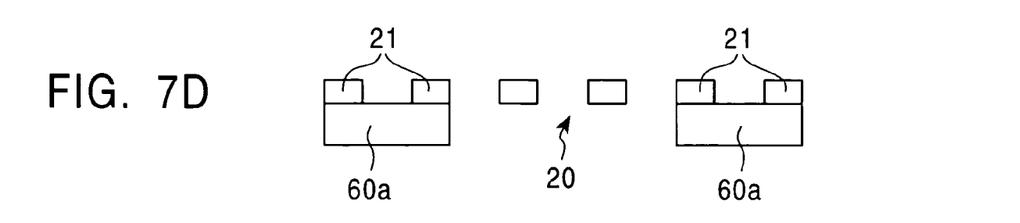

As shown in FIG. 7D, since adjacent base portions 21 of the spiral contactors 20 are connected by the substrate 60a; the spiral contactors 20 are not separated. The substrate 60a has the same function as the guide frame 45 described in FIG. 6E.

Figure 7E:
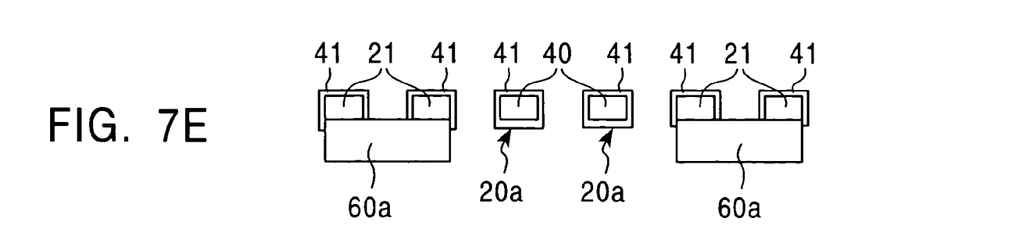

In the step shown in FIG. 7E, an auxiliary resilient layer 41 is formed on the surface of the contactor segments 20a, which form each turn of the spiral contactors, and on the surface of the base portions 21 by electroless plating. In the electroless plating, which is also known as chemical plating, a metal salt is deposited on the surface of a substrate utilizing only a chemical reaction of a reducing substance and a metal ion in a plating solution.

According to this method, the entire surfaces of the conductive layer 40 can be appropriately covered with the auxiliary resilient layer 41. In the formation of the spiral contactors 20, when the metal foil used in the step shown in FIG. 7A is composed of a material of the auxiliary resilient layer 41, the conductive layer 40 is formed on the surface of the auxiliary resilient layer 41 by electroless plating in the step shown in FIG. 7E.

The method shown in FIGS. 8A to 8F will now be described.

Figure 8A:
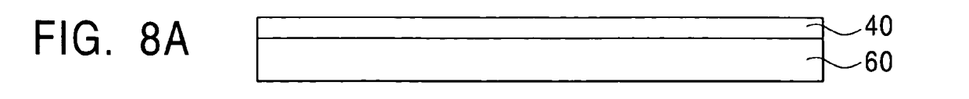
FIGS. 8A to 8F are process drawings showing a third method of the present invention.

Referring to FIG. 8A, a conductive layer 40 of the present invention composed of a metal foil is applied on a substrate 60 composed of an insulating resin such as polyimide.

The conductive layer 40 is preferably composed of a Corson alloy containing Cu, Si, and Ni. The Corson alloy containing Cu, Si, and Ni has both high electrical conductivity and high strength, and therefore, is suitable for the material of the spiral contactors.

According to the present embodiment, a Corson alloy having a composition of Cu—Ni—Si—Mg is used. The Corson alloy contains 96.2 mass percent of Cu, 3.0 mass percent of Ni, 0.65 mass, percent of Si, and 0.15 mass percent of Mg.

According to the Corson alloy having this composition ratio, the electrical conductivity at 20° C. is 42 to 53% IACS, the tensile strength is 607 to 840 N/mm$^2$, the specific resistance at 20° C. is 38.3 nΩ·m, the thermal conductivity is 180 W/mK, the coefficient of thermal expansion is $17.6 \times 10^{-6}$/K (20° C. to 300° C.), the elastic modulus is 131 kN/mm$^2$, and the density is 8.82 g/cm$^3$.

The substrate 60 need not be an insulating member. The use of the substrate 60 composed of an insulating material such as a resin is preferable because the substrate 60 can be used as the guide frame 45 in the following step as described in the step shown in FIG. 6E.

Figure 8B:
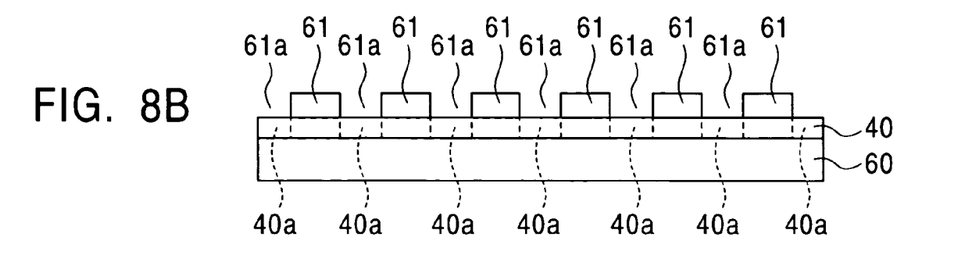

In the step shown in FIG. 8B, a resist 61 is applied on the conductive layer 40. The resist 61 is exposed and developed such that a part of the resist 61 having the shape of the spiral contactors 20 remains and the other part of the resist 61 is removed. In other words, a pattern 61a formed in the resist 61 has the opposite pattern of the resist 51 described in FIG. 6B. In this case, referring to the left figure in FIG. 6B, the shaded area shows the pattern 61a formed in the resist 61 and the white area shows the area where the resist 61 remains.

Subsequently, a conductive layer 40a exposed in the pattern 61a is removed by, for example, etching. The conductive layer 40 having the shape of the spiral contactor 20 remains on the substrate 60.

Figure 8C:
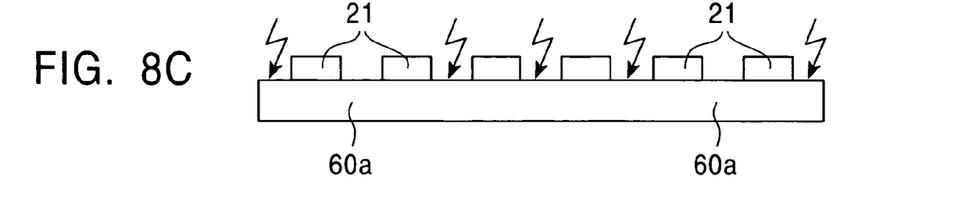

In the step shown in FIG. 8C, the remaining resist 61 is removed. Subsequently, a part of the substrate 60 is removed using, for example, a laser (shown by zigzagged arrows in the figure) such that the other part of the substrate 60, i.e., a substrate 60a, disposed just between the base portions 21 of the spiral contactors 20 remains.

Figure 8D:
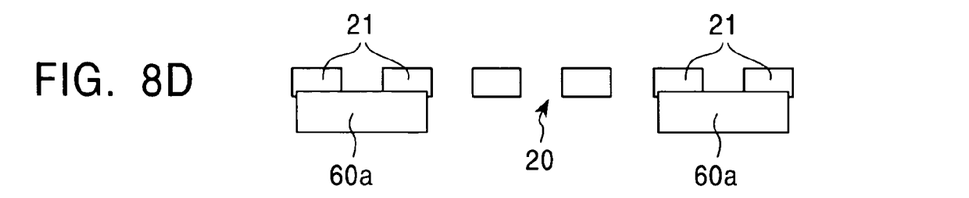

As shown in FIG. 8D, since adjacent base portions 21 of the spiral contactors 20 are connected by the substrate 60a; the spiral contactors 20 are not separated. The substrate 60a has the same function as the guide frame 45 described in FIG. 6E.

Figure 8E:
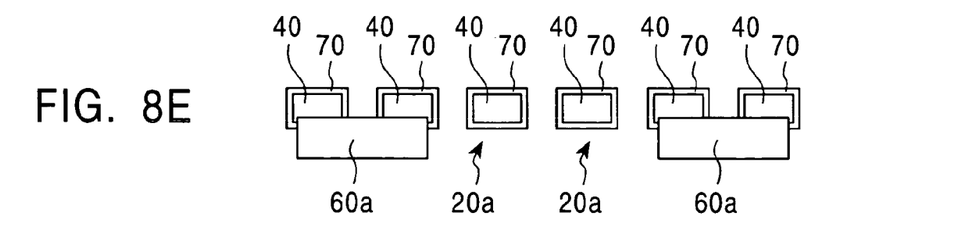

In the step shown in FIG. 8E, an adherent layer 70 is formed on the surfaces of the contactor segments 20a, which form each turn of the spiral contactors, and the base portions 21 by plating. Since an underlayer for electrolytic plating cannot be formed around the spiral contactors 20, electroless plating is required to form the adherent layer 70. In the electroless plating, which is also known as chemical plating, a metal salt is deposited on the surface of a substrate utilizing only a chemical reaction of a reducing substance and a metal ion in a plating solution.

Before the adherent layer 70 is formed by plating, palladium, which functions as a catalyst in a reductive reaction of the electroless plating, is adhered to the peripheries of the contactor segments 20a and the base portions 21. In the adhesion of palladium, the peripheries of the contactor segments 20a and the base portions 21 are submerged in an aqueous solution of palladium chloride or an aqueous solution of palladium sulfate to deposit palladium. Before the step of adhesion of palladium, pretreatments such as degreasing and a surface treatment by etching are preferably performed.

The adherent layer 70 is composed of a metal selected from the group consisting of Cu, Ag, Au, Ru, Rh, Pd, Os, Ir, and Pt. The adherent layer 70 preferably has a thickness of 0.01 to 0.1 µm.

Figure 8F:
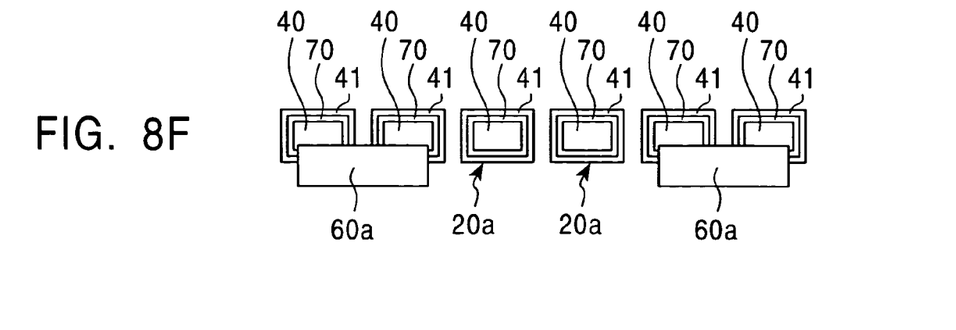

In the step shown in FIG. 8F, an auxiliary resilient layer 41 is formed on the adherent layer 70 by electroless plating. The auxiliary resilient layer 41 has a thickness of 0.5 to 10 µm.

The composition of a plating solution used for the electroless plating is as follows:

| | |
|---|---|
| $NiSO_4 \cdot H_2O$ | 0.1 mol/L |
| $NaH_2PO_2 \cdot 6H_2O$ | 0.2 mol/L |
| Citric acid | 0.5 mol/L |
| $(NH_4)_2SO_4$ | 0.5 mol/L |

When the conductive layer 40 is composed of a copper alloy such as a Corson alloy containing not only Cu but also, for example, Si and Ni, elements such as Si and Ni are precipitated on the surface of the conductive layer 40. This causes an uneven distribution of the composition on the surface of the conductive layer 40. When Ni or Ni—X wherein X is at least one element selected from the group consisting of P, W, Mn, Ti, and Be is directly formed by plating, in particular, by electroless plating on the uneven surface of the conductive layer 40, the auxiliary resilient layer 41 does not have a uniform thickness.

As shown in FIG. 8F, the formation of the auxiliary resilient layer 41 on the adherent layer 70 by plating readily allows the thickness of the auxiliary resilient layer 41 composed of Ni or Ni—X wherein X is at least one element selected from the group consisting of P, W, Mn, Ti, and Be to be uniform. Consequently, the resilient properties of the spiral contactors are stabilized. Furthermore, the adhesiveness of the plated auxiliary resilient layer 41 is improved.

According to this method, the entire surfaces of the conductive layer 40 can be appropriately covered with the auxiliary resilient layer 41. In the formation of the spiral contactors 20, when the metal foil used in the step shown in FIG. 8A is composed of a material of the auxiliary resilient layer 41, the adherent layer 70 is formed on the surface of the auxiliary resilient layer 41 by electroless plating, and then the conductive layer 40 is formed on the surface of the adherent layer 70 by electroless plating.

In particular, when the auxiliary resilient layer 41 is composed of NiP, the NiP preferably has a composition $Ni_{100-X}P_X$ wherein X satisfies $30 \geq x \geq 10$ by atomic percent.

When the phosphorus concentration in the NiP (nickel-phosphorus) alloy used as the auxiliary resilient layer 41 is 10 atomic percent or more, the precipitation of nickel crystal is suppressed, and therefore, resilient properties such as mechanical strength are improved. In addition, stress (in particular, compressive stress) by plating is suppressed, and therefore, generation of defects by plating can be suppressed.

When the phosphorus concentration in the NiP alloy exceeds 30 atomic percent, various intermetallic compounds containing Ni and P are precipitated. The resilient properties of the NiP alloy are deteriorated because of the very high hardness and brittleness due to the intermetallic compounds.

When the phosphorus concentration in the NiP alloy is 10 to 30 atomic percent, the NiP alloy has not only ductility but also desired resilient properties due to the presence of an amorphous phase. An example of the desired resilient properties includes a standard in which the tensile strength is at least 1,000 MPa.

Figure 9:
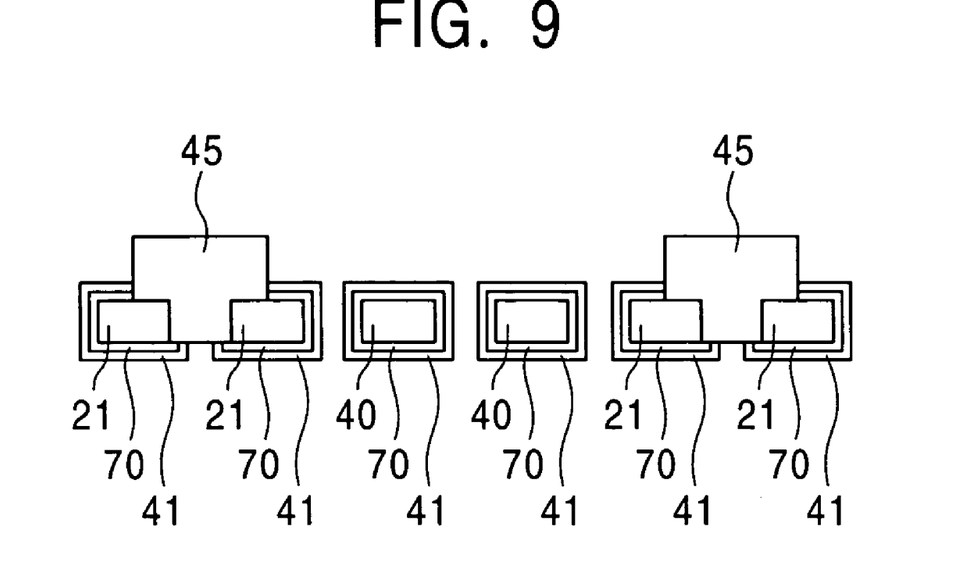
FIG. 9 is a process drawing wherein an adherent layer and an auxiliary resilient layer are formed by electroless plating after the step shown in FIG. 6F.

FIG. 9 will now be described. In the step shown in FIG. 6C, for example, the conductive layer 40 is formed by electrolytic plating, and then the steps shown in FIGS. 6D to 6F are performed. Subsequently, as shown in FIG. 9, the adherent layer 70 and the auxiliary resilient layer 41 are formed around the conductive layer 40 by electroless plating described above.

Figure 10:
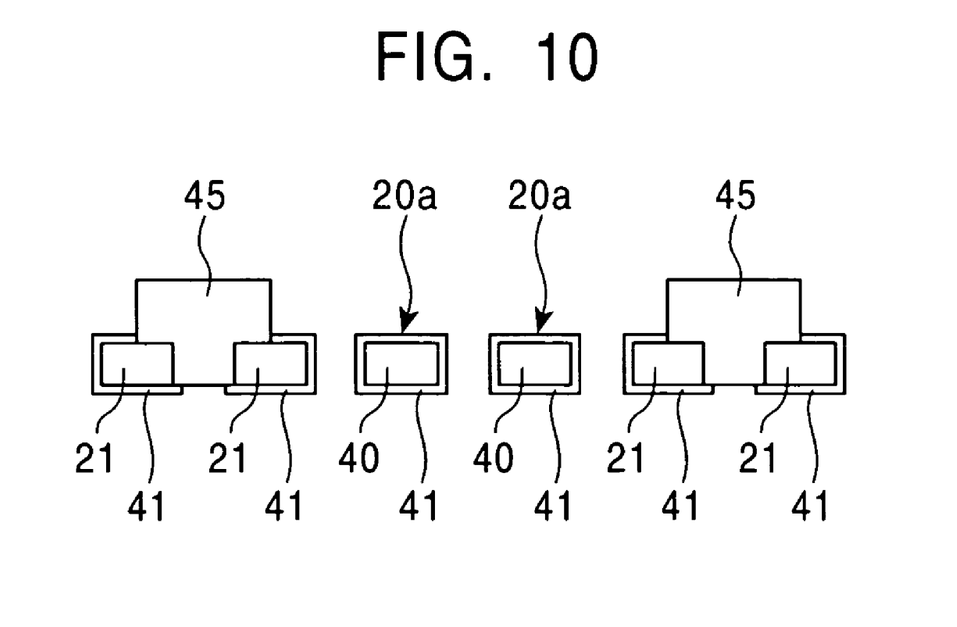
FIG. 10 is a process drawing wherein an auxiliary resilient layer is formed by electroless plating after the step shown in FIG. 6F.

FIG. 10 will now be described. In the step shown in FIG. 6C, for example, the conductive layer 40 is formed by electrolytic plating, and then the steps shown in FIGS. 6D to 6F are performed. Subsequently, as shown in FIG. 10, the auxiliary resilient layer 41 is formed around the conductive layer 40 by electroless plating described above.

Figure 11A:
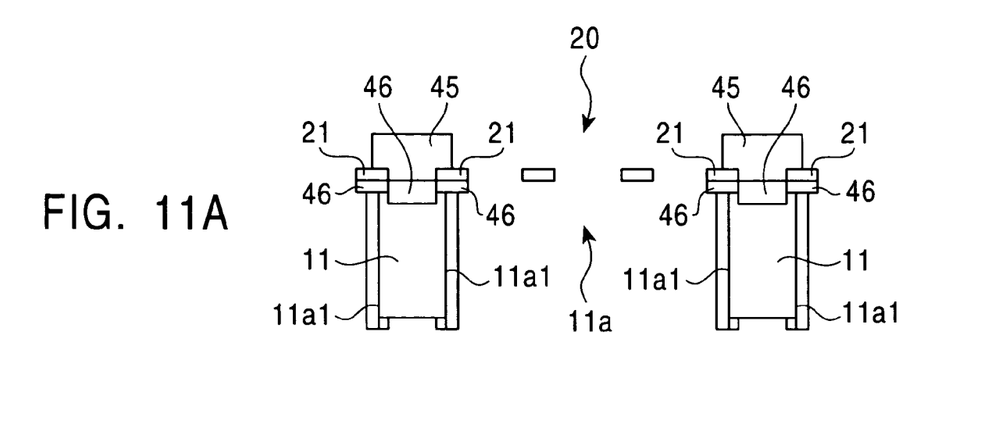
FIGS. 11A to 11C are process drawings performed after the steps shown in FIGS. 6A to 6F, 7A to 7E, or 8A to 8F.
Figure 11B:
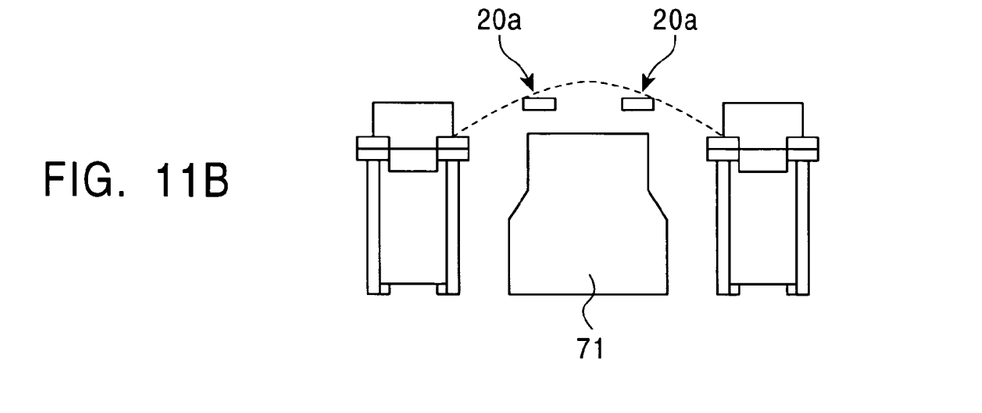
Figure 11C:
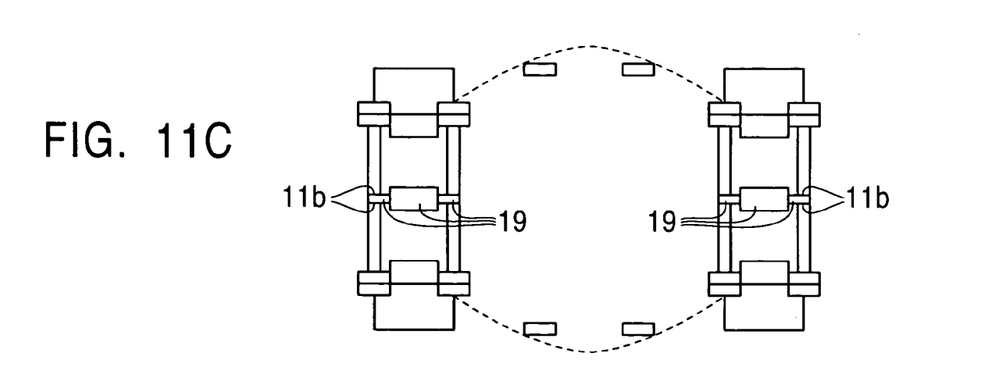

According to the present invention, the spiral contactors 20 are formed by the methods described above and then the steps shown in FIGS. 11A to 11C are performed. In FIGS. 11A to 11C, a base 11 used for connecting a spiral contactor 20 is the same base 11 as described in FIG. 5.

Referring to FIG. 11A, a base 11 includes a hole 11a facing the spiral contactor 20. An internal surface 11a1 of the hole 11a is formed by, for example, plating. In addition, in the base 11, an anisotropic conductive adhesive 46 is applied on the upper end (i.e., upper periphery) of the holes 11a, the upper end facing base portions 21 of the spiral contactors 20, and areas disposed between the upper ends. This base 11 is fixed with the base portions 21 of the spiral contactors 20 by the anisotropic conductive adhesive 46.

In the step shown in FIG. 11B, contactor segments 20a of each turn of the spiral contactor 20 are protruded upward by pushing up a protrusion adjusting member 71 disposed in the hole 11a. In this step, the protrusion is adjusted such that a contactor segment 20a disposed at the inner side is protruded higher than a contactor segment 20a disposed at the outer side, in other words, the contactor segments 20a form a convex shape as viewed from a side face. The broken lines in FIGS. 11B and 11C show that a plurality of contactor segments 20a are disposed along the broken lines.

The steps described in FIGS. 11A and 11B are performed using two bases 11. In the step shown in FIG. 11C, bottom faces 11b of the bases 11 are fixed by bonding with an anisotropic conductive adhesive 19, thereby producing the connecting unit shown in FIG. 5.

What is claimed is:

1. A connecting unit for establishing a connection with a plurality of external connecting portions of an electronic device, the connecting unit comprising
   a base; and
   a plurality of spiral contactors formed on the base and having a spiral shape, the spiral contactors being put in contact with the external connecting portions of the electronic device,
   wherein each of the spiral contactors comprises:
      a conductive layer for transmitting an electrical signal, the cross section of an outer shape of the conductive layer being a quadrangle; and
      an auxiliary resilient layer formed on a surface of the conductive layer, the auxiliary resilient layer covering the surface of the conductive layer such that the conductive layer is completely surrounded by the auxiliary resilient layer in a cross section, the cross section of an outer shape of the auxiliary resilient layer being a quadrangle,
   wherein the conductive layer is a single layer having a specific resistance lower than a specific resistance of the auxiliary resilient layer and being composed of copper or a copper alloy; and the auxiliary resilient layer comprises a Ni—P alloy having a yield point and an elastic modulus higher than a yield point and an elastic modulus of the conductive layer, the auxiliary resilient layer having a thickness to provide desired resilient properties to the spiral contactors,
   and wherein the auxiliary resilient layer comprises $Ni_{100-x}P_x$, where $10 \leq x \leq 30$ by atomic percent, and contains an amorphous phase.

2. A connecting unit for establishing a connection with a plurality of external connecting portions of an electronic device, the connecting unit comprising
   a base; and
   a plurality of spiral contactors formed on the base and having a spiral shape, the spiral contactors being put in contact with the external connecting portions of the electronic device,
   wherein each of the spiral contactors comprises:
      a conductive layer for transmitting an electrical signal, a cross section of an outer shape of the conductive layer being a quadrangle; and
      an auxiliary resilient layer formed on a surface of the conductive layer, the auxiliary resilient layer covering the surface of the conductive layer such that the conductive layer is completely surrounded by the auxiliary resilient layer in a cross section, the cross section of an outer shape the auxiliary resilient layer being a quadrangle;
   wherein the conductive layer is a single layer having a specific resistance lower than a specific resistance of the auxiliary resilient layer and being composed of copper or a copper alloy; and the auxiliary resilient layer comprises a Ni—P alloy, the auxiliary resilient layer having a yield point and an elastic modulus higher than a yield point and an elastic modulus of the conductive layer, respectively, the auxiliary resilient layer having a thickness to provide desired resilient properties to the spiral contactors,
   and wherein the auxiliary resilient layer comprises $Ni_{100-x}P_x$, where $10 \leq x \leq 30$ by atomic percent, and contains an amorphous phase.

3. The connecting unit according to claim 2, wherein a coating layer comprising a material having a specific resistance lower than the specific resistance of the auxiliary resilient layer is provided on a surface of the auxiliary resilient layer.

4. The connecting unit according to claim 2, wherein the conductive layer comprises a Corson alloy containing Cu, Si, and Ni.

5. The connecting unit according to claim 4, wherein an adherent layer is disposed between the conductive layer and the auxiliary resilient layer, the adherent layer being composed of a metal selected from the group consisting of Cu, Ag, Au, Ru, Rh, Pd, Os, Ir, and Pt.

6. The connecting unit according to claim 5, wherein the adherent layer has a thickness of 0.01 to 0.1 µm.

7. The connecting unit according to claim 2, wherein the Ni—P alloy has a tensile strength of at least 1,000 MPa.

8. The connecting unit according to claim 2, wherein the auxiliary resilient layer has a thickness of 0.5 to 10 µm.

9. The connecting unit according to claim 2, wherein a cross-section of the conductive layer is rectangular in shape, and has corners.

10. The connecting unit according to claim 2, wherein a thickness of the conductor layer is greater than a thickness of the auxiliary resilient layer.

* * * * *